(12) United States Patent
Coleman et al.

(10) Patent No.: US 10,700,731 B2
(45) Date of Patent: Jun. 30, 2020

(54) METHOD AND APPARATUS FOR CONVERTING DC VOLTAGES ON A TOWER

(71) Applicant: CommScope Technologies LLC, Hickory, NC (US)

(72) Inventors: Daryl A. Coleman, Winchester, VA (US); Khalid W. Al-Mufti, Sterling, VA (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/419,308

(22) Filed: May 22, 2019

(65) Prior Publication Data

US 2019/0273526 A1    Sep. 5, 2019

Related U.S. Application Data

(63) Continuation of application No. 15/939,973, filed on Mar. 29, 2018, now Pat. No. 10,396,844.

(60) Provisional application No. 62/095,255, filed on May 22, 2017.

(51) Int. Cl.
| | |
|---|---|
| *H04M 1/00* | (2006.01) |
| *H04B 1/40* | (2015.01) |
| *H05K 7/20* | (2006.01) |
| *H02H 7/20* | (2006.01) |
| *H02H 9/04* | (2006.01) |
| *H04W 88/08* | (2009.01) |

(52) U.S. Cl.
CPC .............. *H04B 1/40* (2013.01); *H02H 7/20* (2013.01); *H02H 9/04* (2013.01); *H04W 88/085* (2013.01); *H05K 7/209* (2013.01)

(58) Field of Classification Search
CPC .. H04B 1/40; H02H 7/20; H02H 9/04; H04W 88/085; H05K 7/209
USPC .............................. 455/560, 561, 562.1, 97
See application file for complete search history.

(56) References Cited

U.S. PATENT DOCUMENTS

| | | | |
|---|---|---|---|
| 6,864,688 B2 * | 3/2005 | Beutelschiess | ........... B60L 3/00 |
| | | | 324/551 |
| 9,099,860 B2 | 8/2015 | Martinez et al. | |
| 9,448,576 B2 | 9/2016 | Chamberlain et al. | |
| 9,608,577 B2 * | 3/2017 | Mostov | ................. H03F 1/0227 |
| 9,759,880 B2 | 9/2017 | Chamberlain et al. | |
| 9,813,082 B2 | 11/2017 | Bai et al. | |
| 10,128,685 B2 | 11/2018 | Hanley et al. | |

(Continued)

OTHER PUBLICATIONS

U.S. Patent and Trademark Office, "Office Action", U.S. Appl. No. 15/940,254, dated Jun. 25, 2019, pp. 1-30, Published: US.

(Continued)

*Primary Examiner* — Sonny Trinh
(74) *Attorney, Agent, or Firm* — Fogg & Powers LLC

(57) ABSTRACT

In one embodiment, an integrated power cable is provided. The integrated power cable, comprises a power cable having a first end and a second end; wherein the first end is configured to be electrically coupled to a DC power supply; at least one DC-DC voltage converter having at least one input and at least one output; wherein the second end is fixedly electrically and mechanically connected to the input; a first connector fixedly connected mechanically and electrically to the output; and wherein the first connector is configured to be coupled to at least one remote radio head.

19 Claims, 15 Drawing Sheets

(56) References Cited

U.S. PATENT DOCUMENTS

| | | | |
|---|---|---|---|
| 2005/0238088 A1* | 10/2005 | Piepmeyer | H04W 88/02 375/222 |
| 2008/0265586 A1 | 10/2008 | Like et al. | |
| 2009/0304055 A1 | 12/2009 | Nino et al. | |
| 2011/0148374 A1 | 6/2011 | Gizara | |
| 2011/0309766 A1 | 12/2011 | Weng | |
| 2013/0006435 A1 | 1/2013 | Berrios et al. | |
| 2014/0029431 A1 | 1/2014 | Haberland et al. | |
| 2014/0168842 A1 | 6/2014 | Martinez et al. | |
| 2015/0080055 A1 | 3/2015 | Smentek et al. | |
| 2015/0155669 A1 | 6/2015 | Chamberlain et al. | |
| 2015/0234399 A1 | 8/2015 | Chamberlain et al. | |
| 2015/0234405 A1 | 8/2015 | Chamberlain et al. | |
| 2017/0012668 A1 | 1/2017 | Fang | |
| 2018/0213091 A1 | 7/2018 | Kostakis et al. | |
| 2018/0270750 A1 | 9/2018 | Coleman et al. | |
| 2018/0302804 A1 | 10/2018 | Eleftheriadis et al. | |
| 2018/0337526 A1 | 11/2018 | Al-Mufti et al. | |
| 2018/0337705 A1 | 11/2018 | Coleman et al. | |

OTHER PUBLICATIONS

400V DC Microgrid Small Scale Demo System for Telecom and Datacom Applications; Intelec 2012 (2012): pp. 1-7.

Stark, "380V DC Power: Shaping the Future of Data Center Energy Efficiency", "Data Center Knowledge", "http://www.datacenterknowledge.com/archives/2015/06/25/380v-dc-power-shaping-future-data-center-energy-efficiency/", Dated Jun. 25, 2015, Retrieved on Mar. 21, 2018, pp. 1-5.

Tanaka, Toshimitsu, et al.; "Analysis of Wiring Design for 380-VDC Power Distribution System at Telecommunication Sites"; Intelec 2012 (2012): pp. 1-5.

U.S. Patent and Trademark Office, "Notice of Allowance", U.S. Appl. No. 15/939,973, dated Apr. 25, 2019, pp. 1-10, Published: US.

U.S. Patent and Trademark Office, "Office Action", U.S. Appl. No. 15/939,973, dated Nov. 14, 2018, pp. 1-19, Published: US.

U.S. Patent and Trademark Office, "Notice of Allowance", U.S. Appl. No. 15/940,254, dated Sep. 24, 2019, pp. 1-5, Published: US.

* cited by examiner

METHOD AND APPARATUS FOR CONVERTING DC VOLTAGES ON A TOWER

CROSS-REFERENCE TO RELATED APPLICATIONS

The present application claims priority under 35 U.S.C. § 120 as a continuation of U.S. patent application Ser. No. 15/939,973 filed on Mar. 29, 2018 which in turn claims benefit under 35 U.S.C. § 119 of U.S. Patent Application Ser. No. 62/509,255, filed May 22, 2017; the entire content of the aforementioned patent application is incorporated herein by reference as if set forth herein in its entirety.

BACKGROUND

Modern cellular base stations are separated into two units, a baseband unit and a remote radio head. The baseband unit, or baseband system, is located on the ground, often proximate to a tower. The baseband unit modulates and demodulates digital data. Thus, for example, the baseband unit includes with a modulator and demodulator.

The remote radio head coupled to, and mounted proximate to, one or more antennas on a tower. The remote radio head down converts and up converts the digital data to radio frequencies and amplifies received and transmitted radio frequency signals. This respectively enhances reception sensitivity and broadcast power of the cellular base stations. Thus, for example, the remote radio head includes an upconverter, a down converter, a low noise amplifier, and a power amplifier.

However, the use of a remote radio head requires that power be supplied to the remote radio head, on the tower, through a power cable. However, as disclosed in U.S. Pat. No. 9,448,576, because the length of the power cable can be hundreds of feet and the current drawn by the remote radio head can be, e.g., about 20 Amperes at a voltage level of about fifty volts, the power loss due to the power cable can be significant. U.S. Pat. No. 9,448,576 is incorporated by reference herein as if set forth in its entirety.

Power loss attributable to the power cable is problematic, if the cellular base station needs to operate on backup battery power in the event of a power blackout. The power dissipated by the power cable can be sufficiently large to undesirably reduce the operating time of the cellular base station when powered by a battery backup system. An equally undesirable alternative, due to increased cost, would be to compensate for the loss by increasing the number of batteries in the battery backup system.

To reduce the power loss, the voltage provided to the power cable can be increased to proportionally reduce the current that must be provided to power the remote radio head. The reduction in current reduces power dissipation by the square of the current reduction, or voltage increase.

U.S. Pat. No. 9,448,576 describes increasing the voltage applied to the cable above the maximum power rated input supply voltage for a remote radio head, and then lowering that voltage, with a DC-to-DC converter mounted on the tower, to a level less than the maximum rated input supply voltage for the remote radio head.

In addition to enhancing the performance of the battery backup system, the reduced current reduces cellular base station power dissipation, or ohmic losses, during normal operation, thus reducing operating expenses incurred by a cellular service provider. Alternatively, the cellular service provider can decide to accept higher power loss by utilizing thinner wires in the power cable. In this case, the provider can reduce capital expenditures, e.g. copper conductor costs, while sacrificing operating expenses.

However, operating at higher DC voltages can create risks for humans and cellular base station equipment. Also, DC-to-DC converters voltage levels of relatively high power levels can generate high heat levels. Therefore, there is a need for a system that enhances safety. Further, there is a need for DC-to-DC voltage converter systems that can readily dissipate high heat levels. Further, there is a need for architectures for implementing cellular base station using higher voltages.

SUMMARY

In one embodiment, an integrated power cable is provided. The integrated power cable, comprises a power cable having a first end and a second end; wherein the first end is configured to be electrically coupled to a DC power supply; at least one DC-DC voltage converter having at least one input and at least one output; wherein the second end is fixedly electrically and mechanically connected to the input; a first connector fixedly connected mechanically and electrically to the output; and wherein the first connector is configured to be coupled to at least one remote radio head.

DETAILED DESCRIPTION

Figure 1:
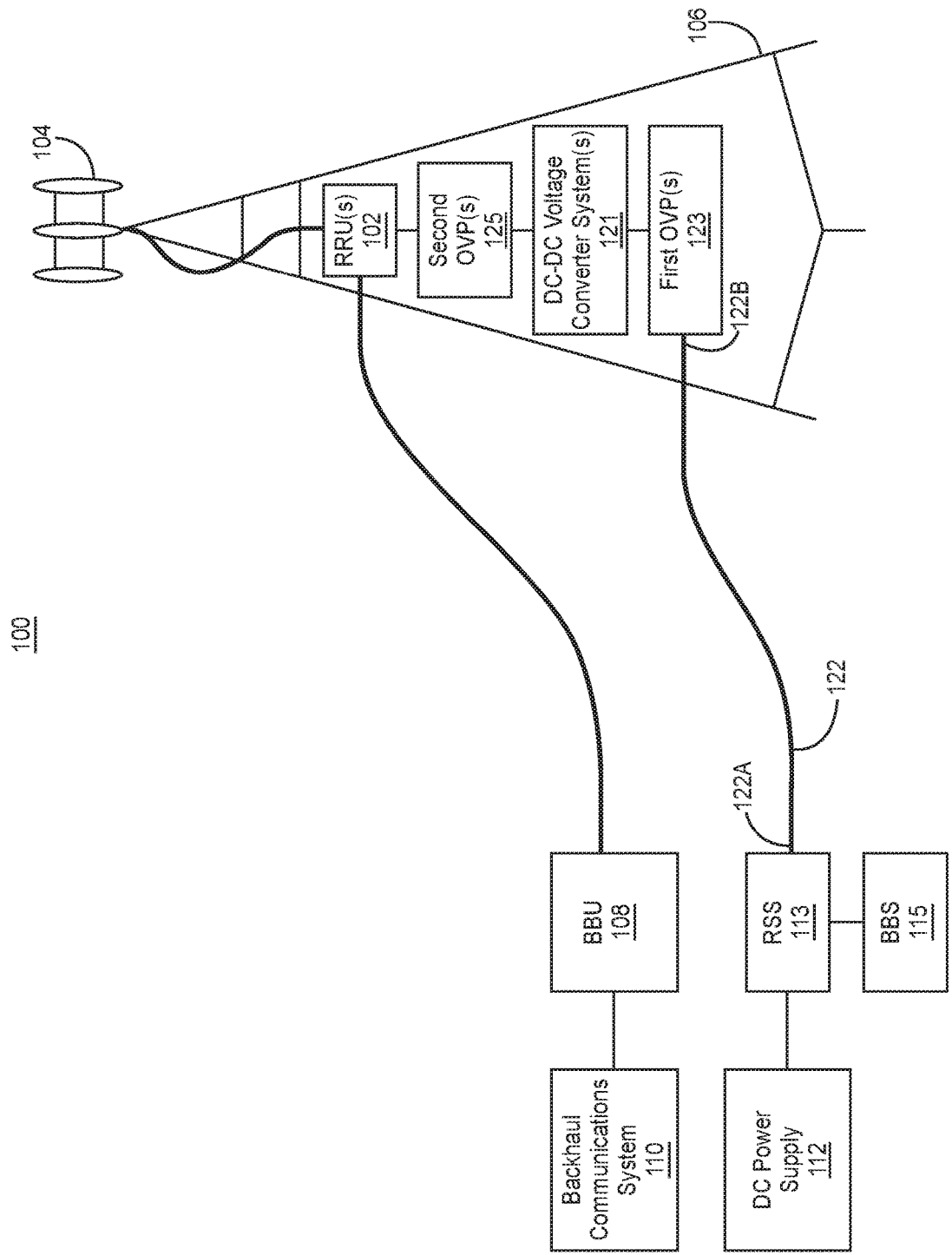
FIG. 1 illustrates a diagram of one embodiment of a cellular base station.

FIG. 1 illustrates a diagram of one embodiment of a cellular base station 100. The cellular base station 100 includes at least one remote radio head (RRH) 102 coupled to at least one antenna 104. The remote radio head 102 and the at least one antenna 104 are mounted on a tower 106. The remote radio head 102 is coupled to a baseband unit (BBU) 108. In another embodiment, the baseband unit 108 is not located on the tower, but in a building or enclosure, e.g. proximate to the base of the tower 106. In a further embodiment, the baseband unit 108 is coupled to a backhaul communications system 110. In yet another embodiment, the backhaul communications system 110 couples the cellular base station 100 to a core network of a cellular communications system.

In one embodiment, the remote radio head 102 is coupled, through at least one DC-DC voltage converter system 121 and a power cable 122, to a DC power supply 112. In another embodiment, the at least one DC-DC voltage converter system 121 is coupled to the DC power supply 112 through a first overvoltage protection circuit (first OVP) 123. In a further embodiment, the at least one DC-DC voltage converter system 121 is coupled to the at least one remote radio head 102 through at least one second overvoltage protection circuit (second OVP(s)) 125.

In one embodiment, the DC power supply 112 is coupled to the at least one DC-DC voltage converter system 121 through a redundancy and safety system (RSS) 113. In another embodiment, a battery backup system (BBS) 115 is coupled to the redundancy and safety system (RSS) 113. In a further embodiment, a safety system may be substituted for the redundancy and safety system 113; the safety system may or may not include redundancy functionality to permit the use of the battery backup system in the event the DC power supply 112 fails.

In one embodiment, the DC power supply 112 generates a relatively high voltage, e.g. 380-400 VDC. By raising the voltage level such a relatively high level, the current is proportionally reduced, and the ohmic losses, e.g. in the power cable 122, is diminished by the proportional factor squared. As a result, conductor diameter of, and/or ohmic losses in, the power cable 122 can be significantly reduced resulting in increased energy distribution efficiency and thus reduced capital and operating costs. In another embodiment, because of the reduced current, conducting material other than copper can be used. For example, aluminium, although higher in resistance, is significantly more abundant and cheaper than copper.

A first end 122A of the power cable 122 is coupled to the DC power supply 112. A second end 122B of the power cable 122 is coupled to the at least one DC-DC voltage converter system 121, or the first OVP 123 (if used). In one embodiment, the at least one DC-DC voltage converter system 121 is mounted on the tower 106. In other embodiments, to the extent each is used, the first OVP 123 and the second OVP(s) 125 are mounted on the tower 106. In a further embodiment, the DC-DC voltage converter system 121, the first OVP 123 and the second OVP 125 are mounted proximate to the remote radio head 102.

Figure 2:
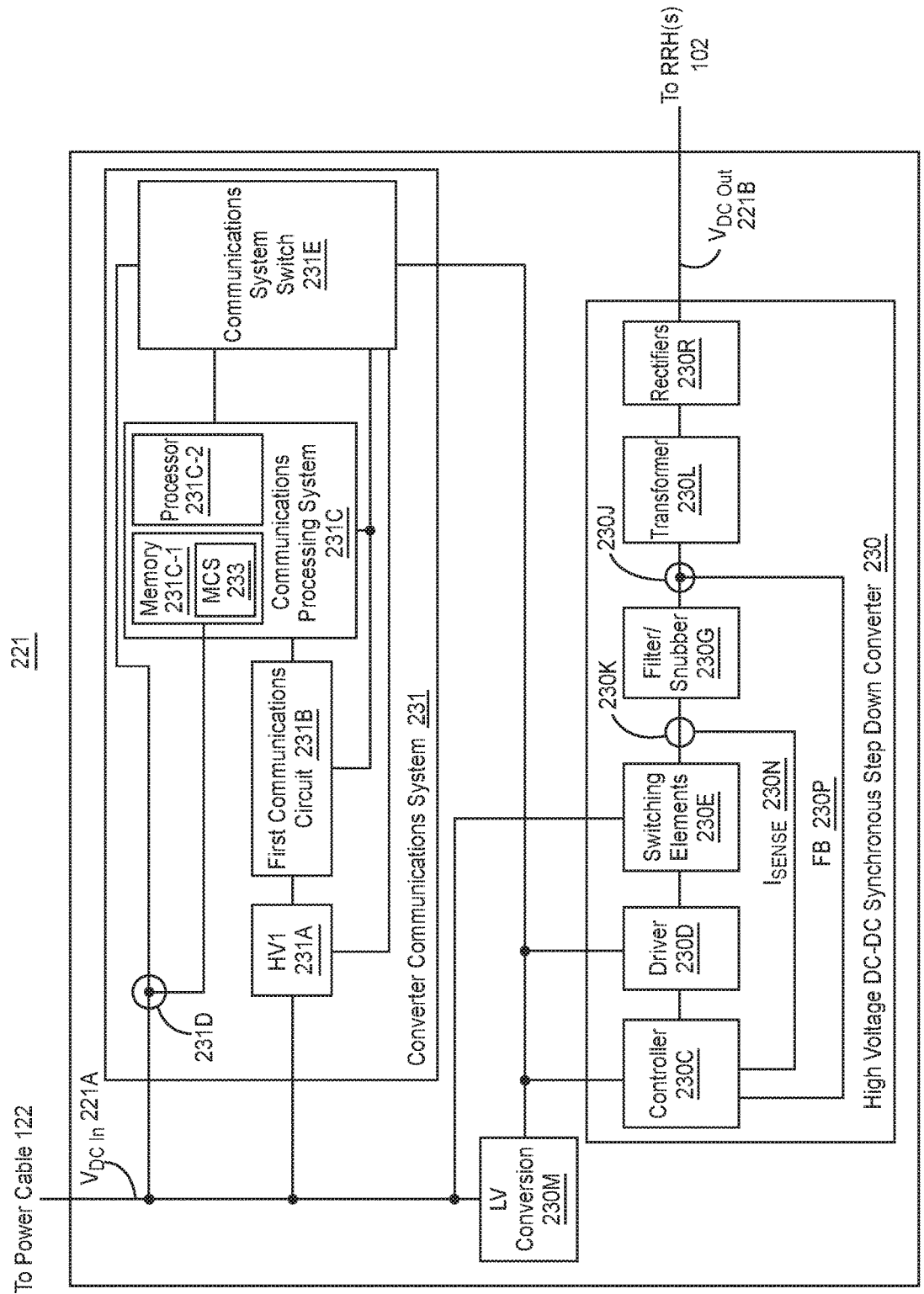
FIG. 2 illustrates one embodiment of a high voltage DC-DC synchronous step-down converter system.

FIG. 2 illustrates a block diagram of one embodiment of a high efficiency high voltage DC-DC synchronous step-down converter system 221. The DC-DC synchronous step-down converter system 221 includes a high voltage DC-DC synchronous step-down converter 230 coupled to a converter communications system 231. However, in another embodiment, the first communications system 231 can be located elsewhere, i.e. not in the DC-DC synchronous step-downconverter system 221, on the tower 106, e.g. proximate to the remote radio head 102.

A synchronous step-down converter is utilized to provide the high efficiency for the high voltage DC-DC synchronous step-down converter 230 and the cellular base station 100. In one embodiment, the high voltage DC-DC step-down converter 230 is preferably one or more stages of high efficiency DC-DC voltage converters. Each stage may be a buck converter, a sine amplitude converter (or sine wave amplitude converter), a zero-current/zero resonance converter, an isolated flyback converter, a LLC converter, or a LLC resonant half-bridge converter. For example, should highly regulated, high current output be required, the high voltage DC-DC synchronous step-down converter 230 can be implemented as a single-phase or multi-phase buck converter. In another embodiment, the high voltage DC-DC synchronous step-down voltage converter 230 can be implemented by two or more successive stages of DC-DC buck voltage converters to diminish the input voltage 221A to a lower desired, regulated output voltage 221B.

The high voltage DC-DC synchronous step-down converter 230 reduces an input voltage ($V_{DC\_IN}$) 221A, e.g. 380-400V DC, to the desired, regulated output voltage ($V_{DC\_OUT}$) 221B, e.g.—48V, 12V, 5V, or 3.3V. If the high voltage DC-DC synchronous step-down converter 230 uses two or more stages, the input voltage is successively reduced. For example, a first state may reduce an input voltage from 380/400V to −48V, and a second stage reduces −48V to voltages more suitable for lower voltage electronic devices such as 24V, 12V, 5V or 3.3V. Alternatively, more than two stages can be used.

FIG. 2 illustrates the high voltage DC-DC synchronous step-down converter 230 as a general purpose single stage, single-phase synchronous converter. The illustrated high voltage DC-DC synchronous step-down converter 230 includes a power controller circuit (controller) 230C coupled to a driver circuit (driver) 230D. The driver circuit 230D is coupled to switching elements 230E. In one embodiment, the switching elements 230E are switching transistors such as power metal oxide semiconductor field effect transistors. These switching elements 230E are coupled to the input voltage 221A. In another embodiment, the controller 230C and driver 230D are combined, e.g. into a single integrated circuit, to drive switching elements 230E that remain separate from such combination. The controller circuit 230C and driver circuit 230D, whether separate or combined, require power from a low voltage converter (LV Conversion) 230M for powering internal logic. In a further embodiment, the low voltage converter 230M is a DC-DC converter like those described above, or uses a Zener diode. In yet another embodiment, the low voltage converter 230M is designed to operate with a high input voltage, e.g. 380-400V. In yet a further embodiment, low voltage converter 230M may be implemented like the high voltage DC-DC synchronous voltage converter 230 but have more stages to provide a lower output voltage. In one embodiment, the low voltage converter 230M can be part of the high voltage DC-DC synchronous step down converter, and e.g. comprise one or more additional stages of DC-DC voltage conversion; thus, there would not be a separate low voltage converter 230M but just one or more additional stages of DC-DC voltage conversion in the high voltage DC-DC synchronous step down converter 230 to provide the lower DC voltage. In another embodiment, the controller circuit 230C, driver circuit 230D, and the switching elements 230 may be combined, e.g. into a single integrated circuit.

The output of the switching elements 230E is coupled to a first terminal of a filter/snubber 230G. In one embodiment, the filter/snubber 230G that is implemented as a filter including a series inductor coupled to a shunt capacitor. The desired, regulated output voltage 221B is provided at a second terminal of the filter/snubber 230G. In yet another embodiment, the filter/snubber 230G is not used, and the switching elements 230E are coupled directly to a transformer 230L which isolates the input voltage 221A (which can be a high voltage) from the load, e.g. the remote radio head(s) 102). In yet a further embodiment, the filter/snubber 230G may be a snubber that removes high frequency switching spikes, e.g. a low resistance resistor and capacitor in series which short to ground high frequency spikes from the output of Switching Elements 230E. In another embodiment, the snubber could consist of a fast acting Zener diode. The desired, regulated output voltage 221B is provided at a second terminal of the filter 230G. In yet another embodiment, the filter/snubber 230G may include both a filter and a snubber.

In one embodiment, the DC-DC synchronous step-down-converter 230 includes a current sensor 230K and a first voltage sensor 230J which respectively supply a current feedback signal ($I_{SENSE}$) 230N and a voltage feedback signal (FB) 230P. The controller circuit 230C is configured to receive the current feedback signal ($I_{SENSE}$) 230N and the voltage feedback signal (FB) 230P, and thus provide the desired, regulated output voltage 221B. In another embodiment, the controller circuit 230C uses components within the filter/snubber 230G for current sensing.

In one embodiment, the output of the filter/snubber 230G is coupled to transformer 230L. This embodiment provides isolation as described above. In another embodiment, a stage of rectification (rectifiers) 230R is used to oppose reverse current.

The converter communications system 231 is coupled to the power cable 122. In one embodiment, the converter communications system 231 comprises a first communications circuit 231B, a communications processing system 231C, a voltage sensor 231D, and a communications system switch 231E. The first communications circuit 231B and the communications system switch 231E are coupled to the communications processing system 231C, and are configured to receive commands and/or control signals from the communications processing system 231C. The voltage sensor 231D is coupled to the communications processing system 231C and is configured to provide a signal representative of the voltage level at the input voltage 221A to the communications processing system 231C.

In one embodiment, a first high voltage isolator (HV1) 231A, e.g. an optical isolator, is used to isolate the first communications circuit 231B from a high input voltage, while permitting the first communications circuit 231B to transmit and receive data. In another embodiment, the high voltage isolator 231A may be a Bias Tee that splits the AC, e.g. RF, signals to the first communications circuit 231B (e.g. by means of an AC coupling capacitor) and the DC voltage to the communications system switch 231E (e.g. by means of a DC coupling inductor). In a further embodiment, the DC voltage from the Bias Tee may be provided as the input voltage to the low voltage converter 230M and the high voltage DC-DC synchronous step down converter 230. In this embodiment, the low voltage converter 230M and the high voltage DC-DC synchronous step down converter 230 are connected directly to the output of HV1 231A and not to input voltage 221A as shown in FIG. 2. In another embodiment, the first communications circuit 231B is a power line communications circuit based on orthogonal frequency division multiplexing such as Maxim Integrated Products, Inc. (Maxim's) MAX2990 product or AISG (Antenna Interface Systems Group) compliant transceivers such as Maxim's MAX9947 product.

In one embodiment, the communications processing system 231C comprises a memory 231C-1 coupled to a processor 231C-2. In another embodiment, the memory 231C-1 includes a measurement and control system (MCS) 233, e.g. software executed on the processor 231C-2. The memory 231C-1 may be one or more of semiconductor memory (such as Flash memory, read only memory, and/or random access memory), magnetic memory (such as a hard drive), and/or optical memory such as a DVD and optical reader. The processor 231C-2 may be one or more of a microprocessor (such as an X86, PowerPC, or ARM based microprocessor), a digital signal processor, and/or a microcontroller. In a further embodiment, all or part of the communications processing system 231C is implemented in whole or in part by an application specific integrated circuit and/or a field programmable gate array.

In one embodiment, the communications system switch 231E is a single pole double throw switch implemented with field effect transistors. In another embodiment, the communications system switch 231E is configured to receive both the input voltage 221A and the output voltage from the low voltage converter 230M, and provide one of the voltages (and correspondingly supply power) to the communications processing system 231C, the first communications circuit 231B, and/or the first high voltage isolator 231A. Upon commencing operation, the communications system switch 231E defaults to a providing the input voltage 221A, and corresponding power, to itself and one or more of the communications processing system 231C, the first communications circuit 231B, and/or the first high voltage isolator 231A. Based upon the voltage level measured by the voltage sensor 231D, the communications processing system 231C determines whether the input voltage 221A, for example provided from the redundancy and safety system 113, is a low voltage, e.g. 1.5-12V, or a high voltage, e.g. 380-400V. When the communications processing system 231C determines that the input voltage 221A is a high voltage, then the communications system switch 231E switches so that it provides the output voltage from the low voltage converter 230M, and corresponding power, to itself and one or more of the communications processing system 231C, the first communications circuit 231B, and/or the first high voltage isolator 231A. If the voltage sensor 231D and the communications processing system 231C detect that the voltage level of input voltage 221A reverts back to a low voltage, then the communications system switch 231E switches back to supplying the input voltage 221A at the output of the communications system switch 231E.

In one embodiment, upon becoming powered, and e.g. after initializing, the communications processing system 231C commands the first communications circuit 231B to respond, e.g. with at least one acknowledgement, to queries from the redundancy and safety system 113. In a further embodiment, the communications and switching control, and sensing functionality provided by the communications processing system 231C is provided by the measurement and control system 233.

Figure 3:
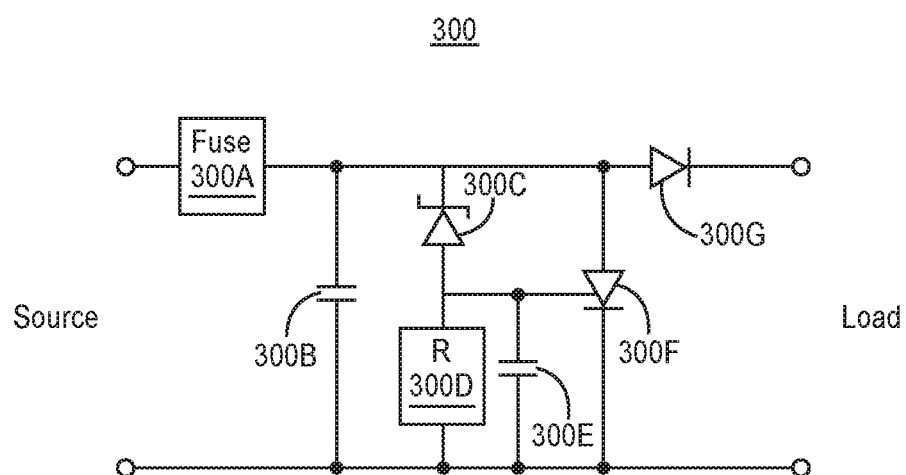
FIG. 3 illustrates a diagram of one embodiment of an overvoltage protection circuit.

As described above, the cellular base station 100 may include a first overvoltage protection circuit 123 and/or at least one second overvoltage protection circuit 125. FIG. 3 illustrates a diagram of one embodiment of an overvoltage protection circuit 300. The overvoltage protection circuit 300 includes a fuse 300A, a first capacitor 300B, a Zener diode 300C, a resistor (R) 300D, second capacitor 300E, a thyristor 300F, and a Schottky diode 300G. The fuse 300A, which may be a resettable fuse, opens if the current drawn from a source by the overvoltage protection circuit 300 exceeds a limit. The first capacitor 300B suppresses voltage spike and noise which may inadvertently trigger the overvoltage protection circuit 300. The Zener diode 300C detects an overvoltage condition, raising the voltage on the gate of the thyristor 300F. As a result, the fuse 300A is blown by the current flowing through the short circuit path created by the thyristor 300F.

The resistor 300D is a pull-down resistor which maintains a low voltage on the gate of the thyristor 300F when the Zener diode 300C is not turned on. The resistor 300D and capacitor 300E also serve as a snubber circuit to prevent the thyristor 300F from being accidently turned on, e.g. when overvoltage protection circuit 300 is powered up. The second capacitor 300E prevents the overvoltage protection circuit 300 from inadvertently turning on.

Figure 4A:
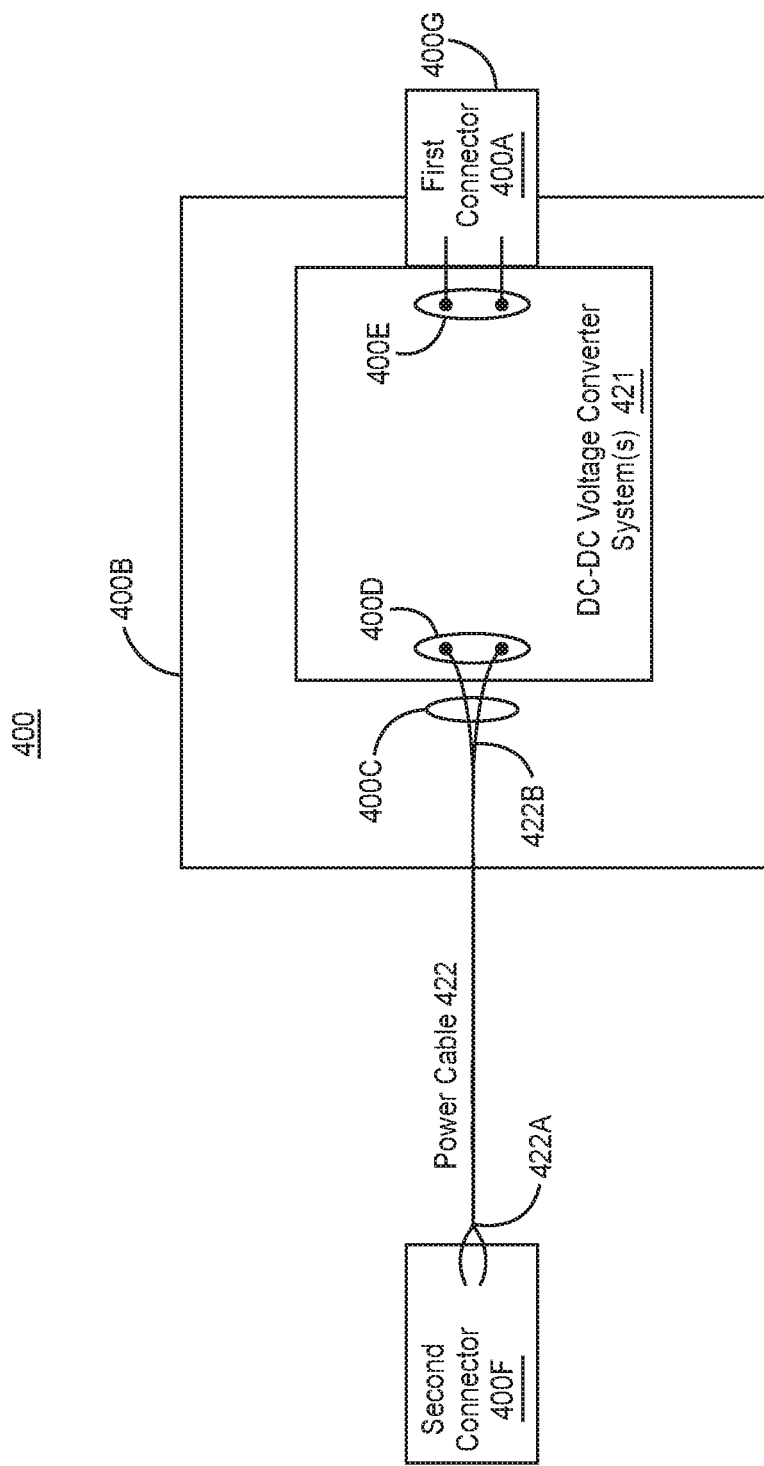
FIG. 4A illustrates a diagram of one embodiment of a power cable with an integrated at least one DC-DC voltage converter system.

The subsequently described techniques illustrate how a high voltage, e.g. 380-400V DC, can be supplied through the power cable 122 to power at least one remote radio head 102 that is configured to receive a lower voltage, e.g. −48V and has components that operate at lower voltages, e.g. 1.5-12V. FIG. 4A illustrates a diagram of one embodiment of a power cable with an integrated at least one DC-DC voltage converter (integrated power cable) 400. Thus, the at least one DC-DC voltage converter systems 421 are made part of the integrated power cable 400, similar to how a connecter is integrated on one end of a cable. This technique has the benefit that no additional equipment, e.g. at least one DC-DC voltage converter system 121 need be mounted on the tower 106. Further, if the at least one DC-DC voltage converter system 121 is exposed to the environment, then no heatsink may be required to dissipate heat from the DC-DC voltage converter system 121.

In one embodiment, one or more pairs of rail (e.g. high voltage) and ground conductors 400C of the second end 422B of the power cable 422 fixedly attached or connected, e.g. by mechanical and/or electrical means such as crimping and/or soldering, to at least one input 400D, e.g. corresponding input terminals, of the at least one DC-DC voltage converter system 421. The at least one DC-DC voltage converter system 421 also has at least one output 400E, e.g. output terminals, at which regulated output voltage(s) are provided. In another embodiment, the at least one output 400E forms a second end 400G of the integrated cable 400. In a further embodiment, the first end 422A of the power cable 422 forms the first end of the integrated power cable 400. In yet another embodiment, the first end 422A is configured to be coupled to the DC power supply 112, e.g. through the redundancy and safety system 113. In yet a further embodiment, the first end 422A is mechanically and electrically fixedly connected to a second connector 400F which is configured to be connected, e.g. to the DC power supply 112 or the redundancy and safety system 113.

In one embodiment, the at least one output 400E is coupled, e.g. fixedly connected mechanically and electrically, to a first connector 400A. In another embodiment, the first connector 400A may part of the integrated power cable 400; thus, the first connecter 400A is the second end of the integrated cable 400. The first connector 400A can be used to couple the integrated power cable 400, e.g. directly or through the at least one second overvoltage protection circuit 125, to the remote radio head 102. In a further embodiment, the first connector 400A is configured to be coupled to a connector of the remote radio head 102.

To protect the at least one DC-DC voltage converter system 421 and the second end 422B of the power cable 422 from the environment, in one embodiment at least a portion of the at least one DC-DC voltage converter system 421 and the second end 422B of the power cable 422 are covered by an insulator 400B such as heat shrink tubing which is heated to snuggly fit around all or part of such components, e.g. the second end 422B of the power cable 422, the at least one DC-DC voltage converter system 421, and the first connector 400A. In a further embodiment, a second connector is connected to the first end 422A of the power cable 422.

Figure 4B:
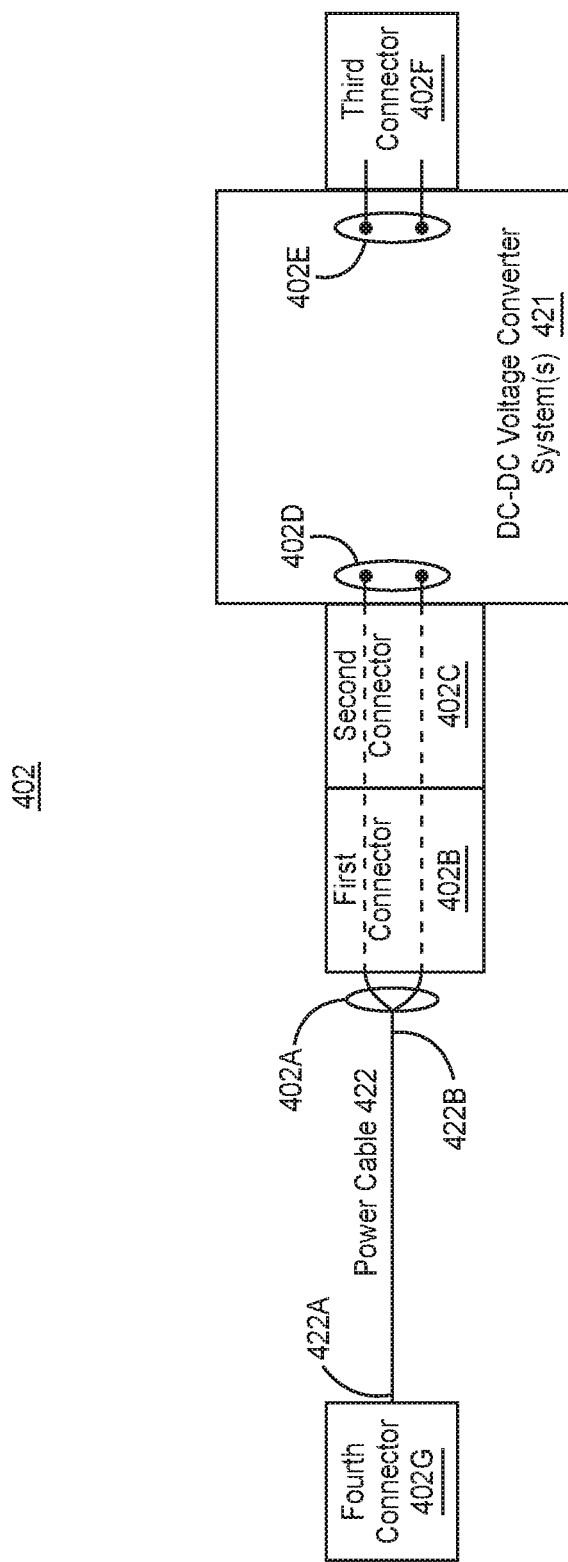
FIG. 4B illustrates a diagram of another embodiment of a power cable with an integrated at least one DC-DC voltage converter.

FIG. 4B illustrates a diagram of another embodiment of a power cable with an integrated at least one DC-DC voltage converter (integrated power cable) 402. In one embodiment, one or more pairs of rail and ground conductors 402A of the second end 422B of the power cable 422 are fixedly attached or connected, e.g. by mechanical and/or electrical means such as crimping and/or soldering, to a first connector 402B. The first connector 402B is electrically and mechanically connected to a second connector 402C. In another embodiment, the first connector 402B and the second connector 402C can be mechanically and electrically connected and disconnected; as a result, one or more pairs of rail and ground conductors 402A of the second end 422B of the power cable 422 are correspondingly be electrically coupled and decoupled to and from corresponding at least one input 402D, e.g. input terminals, of the at least one DC-DC voltage converter system 421.

A third connector 402F, which may be part of the at least one DC-DC voltage converter system 421, is coupled, e.g. fixedly connected mechanically and electrically, to output terminals 402E of the at least one DC-DC voltage converter system 421. The third connector 402F can be used to couple the integrated power cable 402, e.g. directly or through the at least one second overvoltage protection circuit 125, to the remote radio head 102. In one embodiment, a fourth connector 402G is coupled, e.g. fixedly connected mechanically and electrically, to the first end 422A. In another embodiment, the fourth connector 402G is configured to be connected, e.g. to the DC power supply 112 or the redundancy and safety system 113.

Figure 5:
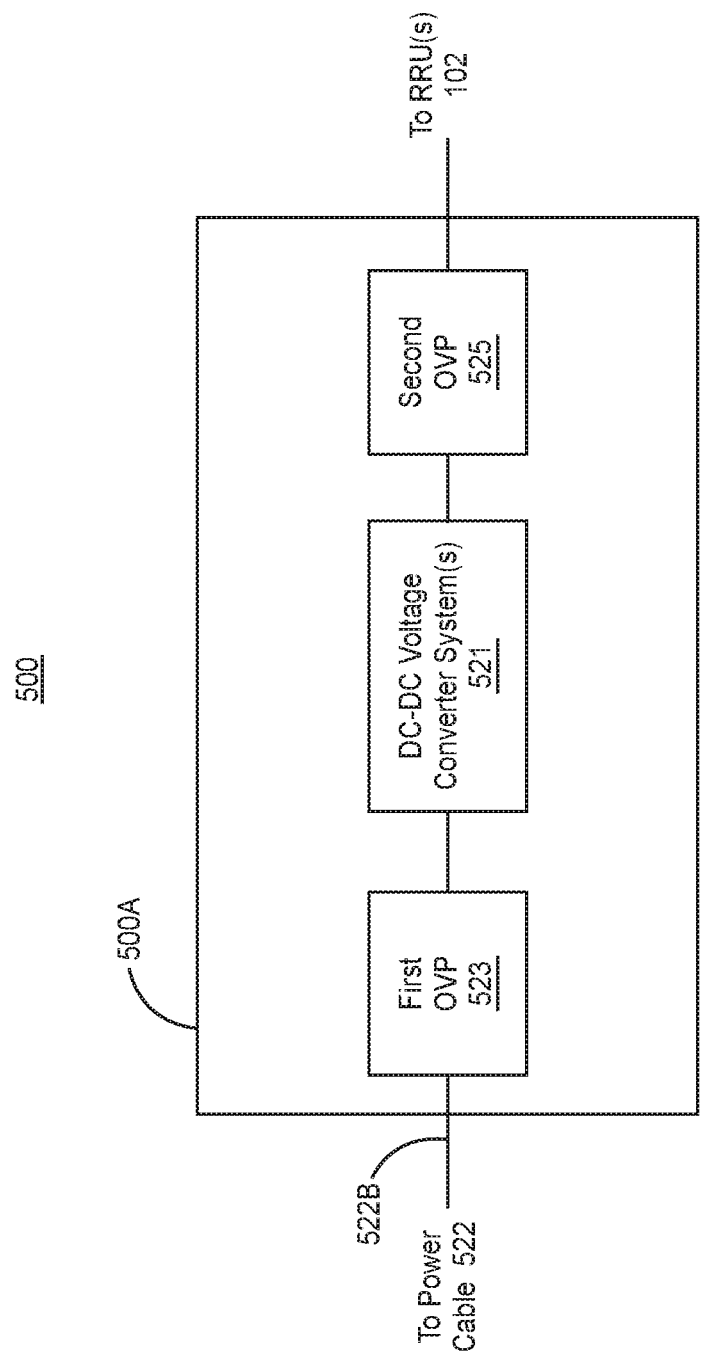
FIG. 5 illustrates a block diagram of one embodiment of a co-packaged system comprised of a co-packaged first over voltage protection circuit, at least one DC-DC voltage converter system, and a second over voltage protection circuit.

FIG. 5 illustrates a block diagram of one embodiment of a co-packaged system 500 comprised of a co-packaged first OVP, at least one DC-DC voltage converter system, and a second OVP. In one embodiment, the first OVP 523, the second OVP 525 and the at least one DC-DC voltage converter system 521 are mounted in and enclosed by the same enclosure 500A. In another embodiment, the enclosure 500A is mounted on the tower 106; this technique also eliminates the need to mount another component on the tower 106.

The input of the first OVP 523 is configured to be coupled to the second end 522B of the power cable 522. An output of the first OVP 523 is coupled to at least one input of the at least one DC-DC voltage converter system 521. At least one output of the at least one DC-DC voltage converter system 521 is configured to be coupled to second OVP 525. At least one output of second OVP 525 is configured to be coupled to the at least one remote radio heads 102.

Because the voltage conversion by the at least one DC-DC voltage converter system 521 has a non-ideal conversion efficiency, e.g. ninety eight percent, some energy is converted to heat, for example by the switching elements 230E. Therefore there is a need for a mechanism to dissipate such heat. FIGS. 6A-6D illustrate diagrams of mechanisms to dissipating the heat.

Figure 6A:
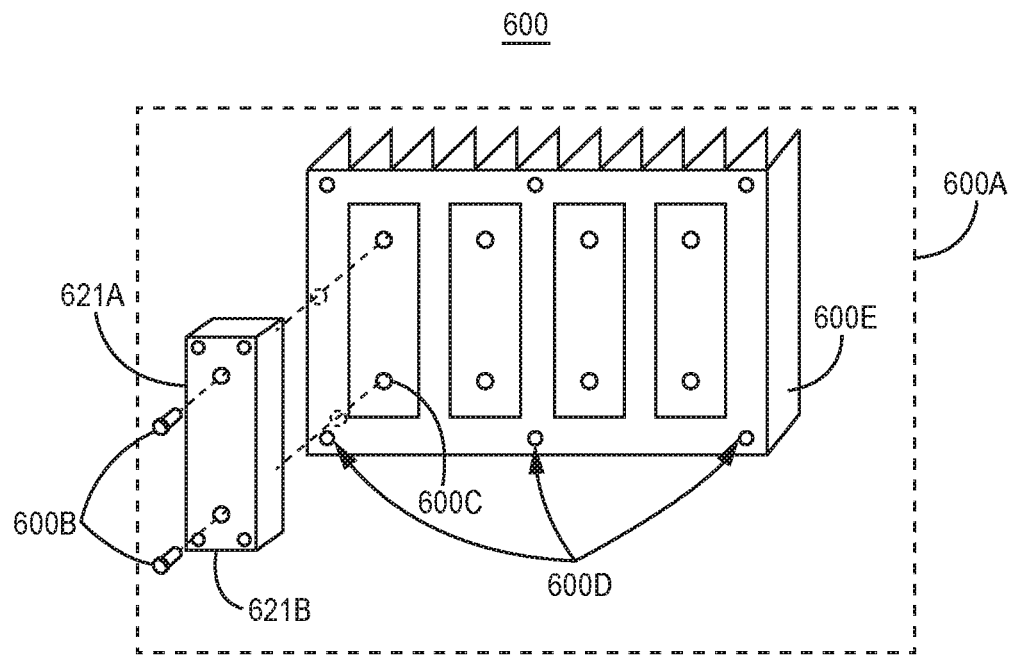
FIG. 6A illustrates a diagram of one embodiment of an enclosure, at least one DC-DC voltage converter system, and a heatsink.

FIG. 6A illustrates a diagram of one embodiment of an enclosure, at least one DC-DC voltage converter system, and a heatsink 600. The heatsink 600E is physically attached to the enclosure 600A, and physically and thermally attached to each DC-DC voltage converter system, such as the illustrated DC-DC voltage converter system 621A. In one embodiment, the heatsink 600 is thermally isolated by the enclosure 600A. In the illustrated embodiment, the heatsink 600E is configured to have up to four DC-DC voltage converter systems attached to the heatsink 600E.

In one embodiment, the heatsink 600E has pairs of threaded holes 600C. Each DC-DC voltage converter system has a corresponding pair of through holes 621B. A pair of threaded bolts 600B is respectively inserted through the pair of through holes 621B and screwed into the pair of threaded holes 600C. This attachment system not only mechanically secures the DC-DC voltage converter system 621A to the heatsink 600E, but as is subsequently described provides good thermal contact.

In one embodiment, a portion of the side of the DC-DC voltage converter system 621A that thermally contacts the heatsink 600E is a thermal conductor such as metal. In another embodiment, the first switching transistor 230E and the second switching transistor 230F thermally contact this thermal conductor. In a further embodiment, conductive heatsink compound, e.g. which may be silicone oil with metal oxide powder, is applied between the thermal conductor of the DC-DC voltage converter system 621A and the heatsink 600E.

Figure 6B:
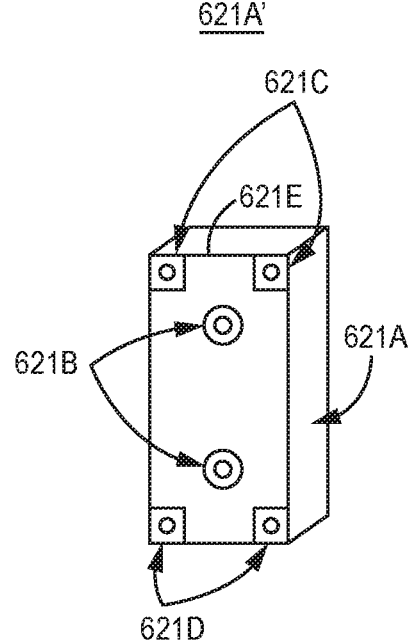
FIG. 6B illustrates a diagram of another embodiment of a DC-DC converter system.

FIG. 6B illustrates a diagram of another embodiment of a DC-DC converter system 621A'. The DC-DC converter system 621A' includes the previously described pair of through holes 621B. The DC-DC converter system 621A' also includes a pair of input voltage contacts 621C at one pair of corners a first side 621E of the DC-DC converter system 621A', and a pair of output voltage contacts 621E at one pair of corners on a second side 621F (opposite the first side) of the DC-DC converter system 621A'. In another embodiment, the input voltage contacts 621C are configured to receive an input voltage of between 380-400V DC. In a further embodiment, the output contacts 621D are configured to provide an output voltage of +/−3.3 to +/−48V, e.g. −48V.

Figure 6C:
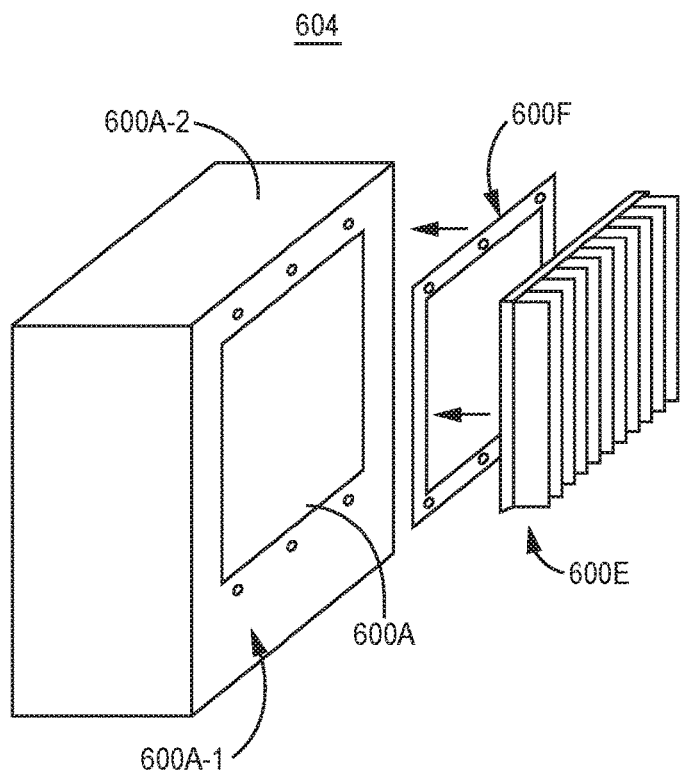
FIG. 6C illustrates a diagram of an embodiment of the enclosure and the heatsink.

FIG. 6C illustrates a diagram of an embodiment of the enclosure and the heatsink 604. The enclosure 600A has a backside 600A-1 and a topside 600A-2. The heatsink 600E is attached, e.g. by bolts, screws and/or other attaching mechanisms to the backside 600A-1. The backside 600A-1 has an opening 600A about which the heatsink 600E is attached; this diminishes undesirable distribution of the thermal energy generated by the at least one DC-DC voltage converter systems 121 to the enclosure 600A, and thus components in the enclosure 600A such as the first OVP 122B, the at least one DC-DC voltage converter systems 121 and second OVP 125. However, the periphery 600E-1 of the heatsink 600E overlaps the backside 600A-1 (where there is no opening 600G) to facilitate attachment of the heatsink 600E to the enclosure 600A. In another embodiment, a thermal insulator gasket 600F is mounted in between the heatsink 600E and the backside 600A-1. The thermal insulator gasket 600F thermally isolates the heatsink 600e from the enclosure 600A. In a further embodiment, the thermal insulator gasket 600F is a silicone rubber, fiberglass, or ceramic cloth or substrate. Alternatively, a conductive heatsink compound can be applied between the heatsink 600E and the backside 600A-1.

Figure 6D:
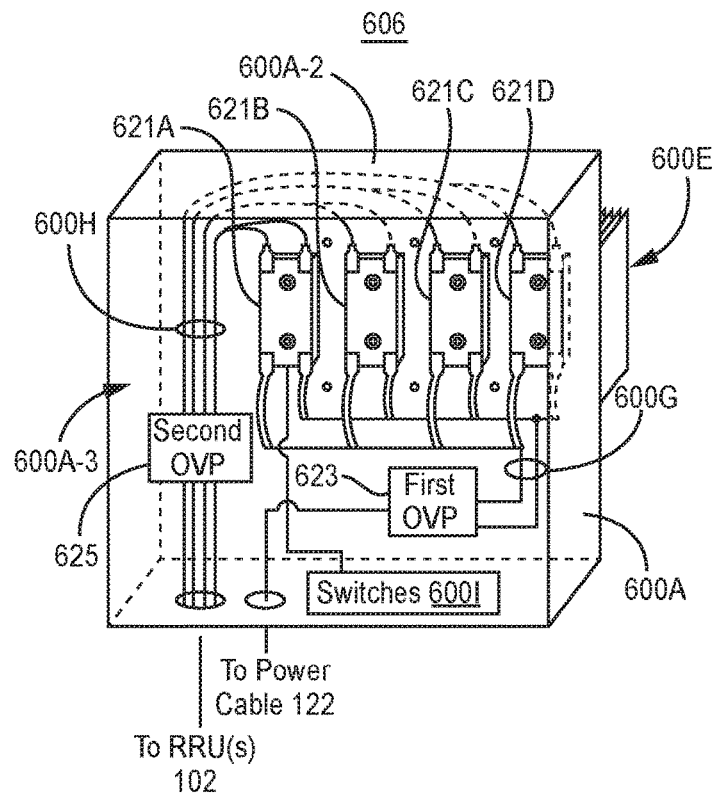
FIG. 6D illustrates a diagram of one embodiment of four DC-DC converter systems, the first over voltage protection circuit and the second over voltage protection circuit mounted in an enclosure.

FIG. 6D illustrates a diagram of one embodiment of four DC-DC converter systems, the first OVP and the second OVP mounted in an enclosure 606. The illustrated view is of the frontside 600A-3 of the enclosure 600E. Each of the four DC-DC converter systems 621A, 621B, 621C, 621D are mounted to the heatsink 600E, e.g. as described above, and coupled between the first OVP 623 and the second OVP 625. The heatsink 600E is mounted to the enclosure 600A, e.g. as described above. A high voltage is provided to each of the four DC-DC converter systems 621A, 621B, 621C, 621D by first conductors 600G. Each DC-DC converter system provides a low voltage output, e.g. isolated from one another or alternatively not, through second conductors 600H.

In one embodiment, at least one interlocking switch (switch(es)) 600I is mounted about the front side 600A-3. In this embodiment, a removable cover plate attaches to the front side 600A-3 to provide service access to the enclosure 600A. In one embodiment, the at least one interlocking switch 600I coupled to at least one of the DC-DC converter systems, for example DC-DC converter system 621A, which include a converter communications system 231 configured to communicate with the redundancy and safety system 113; the at least one interlocking switch 600I is coupled to the communications processing system 231C. When the removable cover plate is mounted on the front side 600A-3, the at least one interlocking switch 600I is closed. When the removable cover plate is dismounted from the front side 600, the at least one interlocking switch 600I is open. The at least one interlocking switch 600I communicates to the communications processing system 231C when the removable cover plate has been removed, and the at least one interlocking switch 600I is open. As a result, the communications processing system 231C, e.g. the MCS 233, commands the first communications circuit 231B to communicate with, or fails to communicate with, the redundancy and safety system 113 so that the redundancy and safety system 113 ceases to provide of high voltage and thus enhances safety and reduces the risk of electrocution to a person servicing the enclosure 600A.

Figure 7:
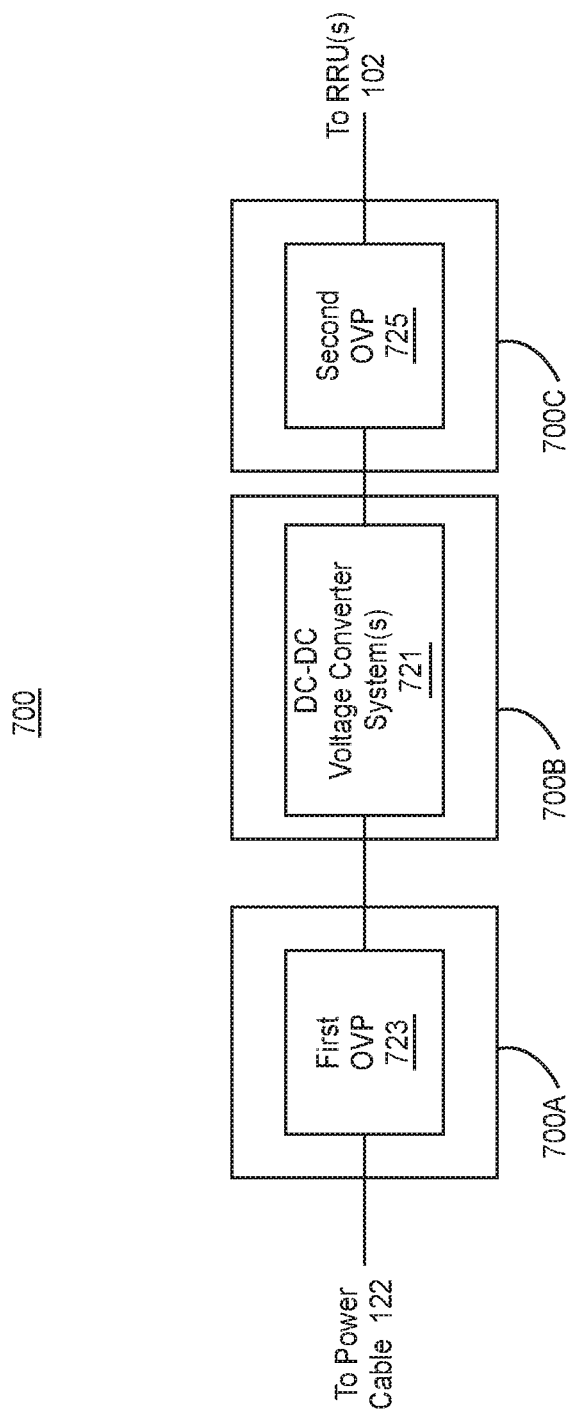
FIG. 7 illustrates one embodiment of the first overvoltage protection circuit, at least one DC-DC voltage converter system and the second overvoltage protection in separate enclosures.

FIG. 7 illustrates one embodiment of the first over voltage protection circuit, at least one DC-DC voltage converter system and the second over voltage protection in separate enclosures 700. The first over voltage protection circuit (OVP) 723 is in a first enclosure 700A and coupled to the power cable 122. The at least one DC-DC voltage converter system 721 is in a second enclosure 700B, and is coupled to the first OVP 723 and the second over voltage protection circuit (OVP) 725. The at least one OVP 724 is in a third enclosure 700C is coupled to at least one RRU 102. If the at least one DC-DC voltage converter system 721 is in a separate enclosure, then there is more flexibility in heatsink design and room to accommodate more individual DC-DC voltage converter systems. In another embodiment, a heatsink is physically attached to the second enclosure, and physically and thermally attached to each DC-DC voltage converter system, such as described above with regards to FIG. 6.

Figure 8A:
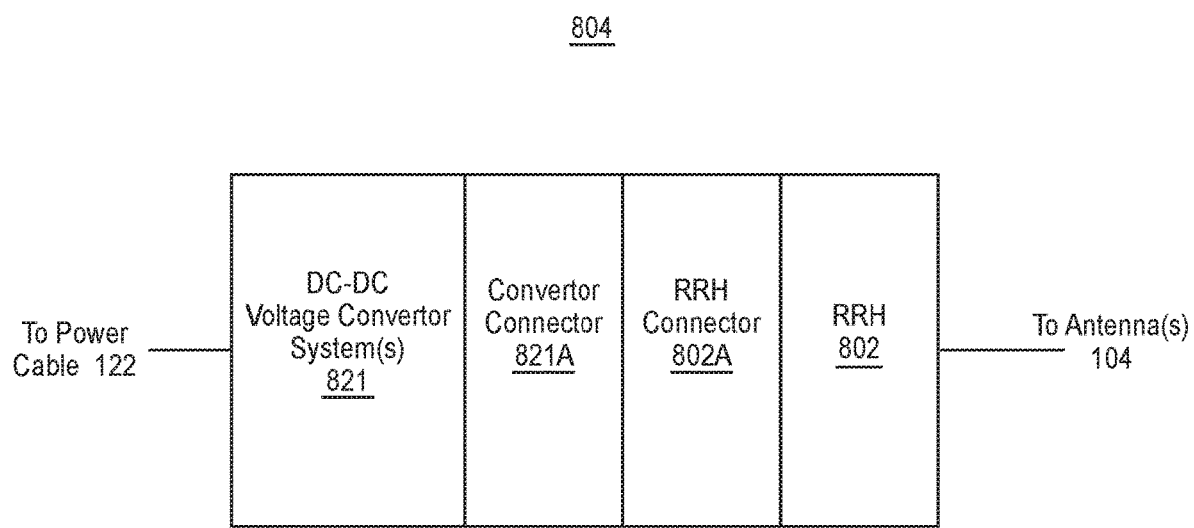
FIG. 8A illustrates a block diagram of one embodiment of a combination of at least one DC-DC voltage converter system and remote radio head coupled through a converter connector and a remote radio head connector.

FIGS. 8A-8D illustrate block diagrams of different techniques for combining at least one DC-DC voltage converter system with one or more remote radio heads. FIG. 8A illustrates a block diagram of one embodiment of a combination of at least one DC-DC voltage converter system and remote radio head coupled through a converter connector and a RRH connector 804. The at least one DC-DC voltage converter system 821 includes a converter connector 821A through which the DC-DC voltage converter 821 supplies power. The at least one DC-DC voltage converter system 821 is coupled to the power cable 122, directly or through the first OVP 123. The remote radio head 802 includes a RRH connector 802A through which the remote radio head 802 receives power. The remote radio head 802 is coupled to the at least one antenna 104. In this embodiment, the at least one DC-DC voltage converter system 821 is coupled to the remote radio head 802 by connecting the converter connector 821A to the RRH connector 802A. If the at least one DC-DC voltage converter 821 is securely attached to the remote radio head 802, e.g. by connectors that mechanically secure to one another, then this technique also can eliminate the need to mount DC-DC voltage converters, e.g. in an enclosure, on a tower. In another embodiment, the power cable 122 and at least one DC-DC voltage converter system 121 are implemented as described in and about FIG. 4B hereof. Further, if exposed to the environment, a heatsink may not be required to dissipate heat from the at least one DC-DC voltage converter 821.

Figure 8B:
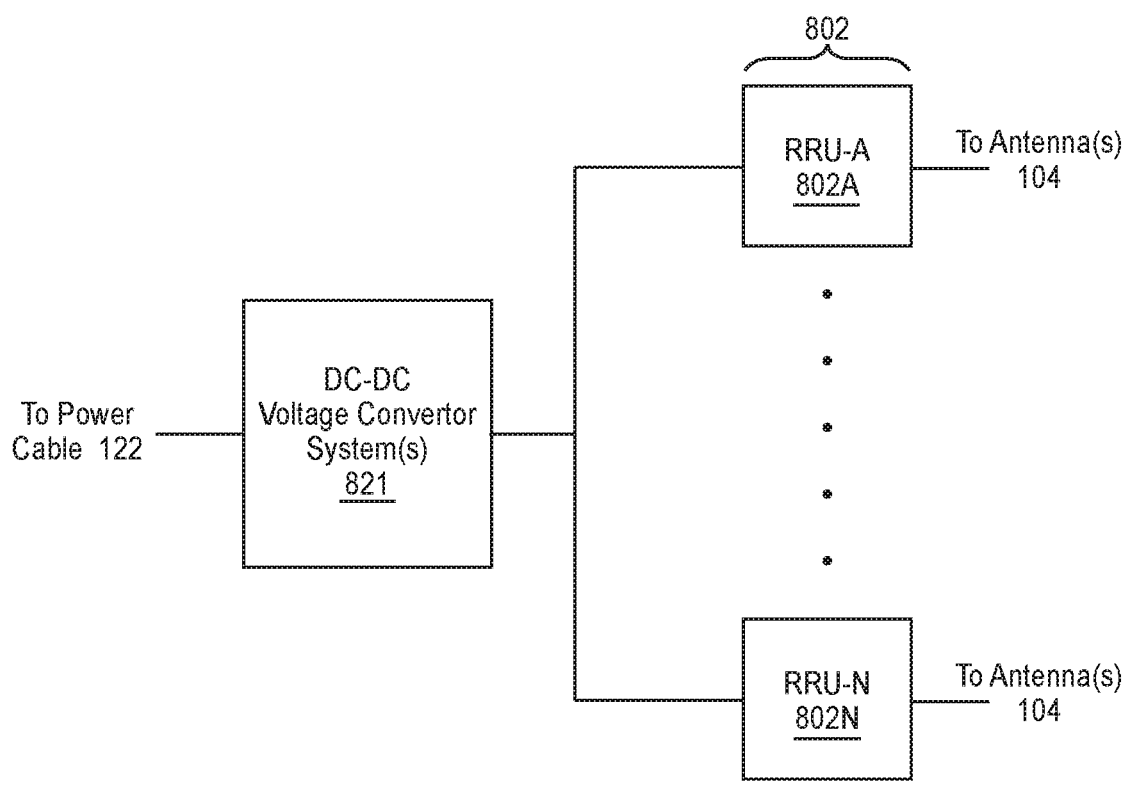
FIG. 8B illustrates a block diagram of one embodiment of at least one DC-DC voltage converter system that provides power to multiple, separate remote radio heads.

FIG. 8B illustrates a block diagram of one embodiment of at least one DC-DC voltage converter 821 that provides power to multiple, e.g. N, separate remote radio heads 802, e.g. remote radio head A 802A through remote radio head N 802N. The at least one DC-DC voltage converter 821 is coupled to the power cable 122, directly or through the first OVP 123. Each remote radio head is coupled to the at least one antenna 104. Because the higher voltage is used, many more remote radio heads 802 can be supplied power for the same power loss over the power cable 122 if a lower voltage level had been used.

Figure 8C:
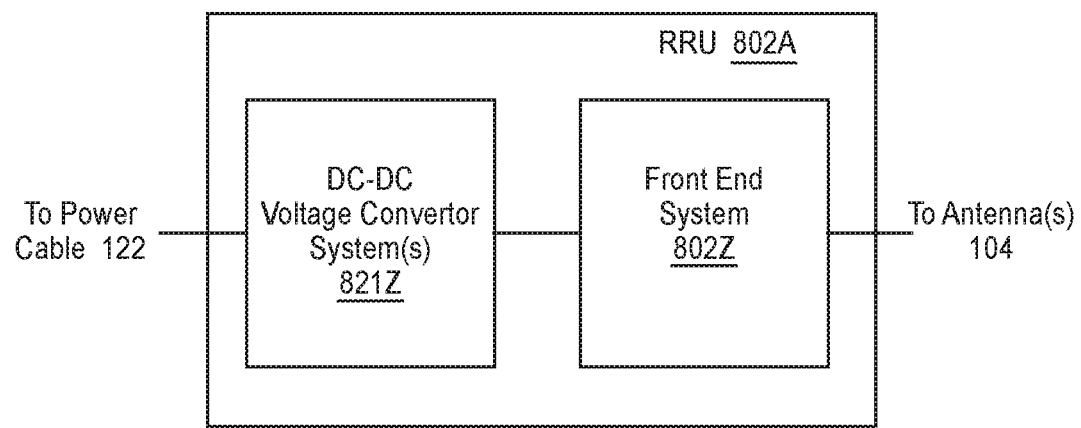
FIG. 8C illustrates a block diagram of one embodiment of a remote radio head incorporating at least one DC-DC voltage converter system incorporated in a remote radio head.

FIG. 8C illustrates a block diagram of one embodiment of a remote radio head incorporating at least one DC-DC voltage converter 821Z incorporated in a remote radio head 802A. The at least one DC-DC voltage converter system 821Z has a first input and a second output. The first input is configured to receive a high voltage, e.g. 380V to 400V, for example from the power cable 122. The at least one DC-DC voltage converter system 821Z converts the high voltage to a lower voltage provided at the second output and useable by one or more components of the remote radio head 802A. In another embodiment, an input of a front end system 802Z (e.g. a power amplifier, low noise amplifier, an upconverter, and a downconverter) are coupled to an output of the DC-DC voltage converter 821Z. Thus, a high voltage, e.g. 380-400V, is provided to the remote radio 802. The at least one DC-DC voltage converter system 821Z converts the high voltage to a lower voltage, e.g. 3.3-12V, useable by components of the remote radio head 821Z, such as the front end system 802Z. Alternatively, the high voltage is converted to a lower intermediate voltage, e.g. 48V; the intermediate voltage is subsequently converted two or more times, e.g. by DC-DC voltage converters and/or a low dropout (LDO) regulators, to a voltage level useable by the components. In a further embodiment, an output of the front end system 802Z, or remote radio head 802A, is coupled to at least one antenna 104. With this embodiment, no additional hardware need be mounted on the tower 106.

Figure 8D:
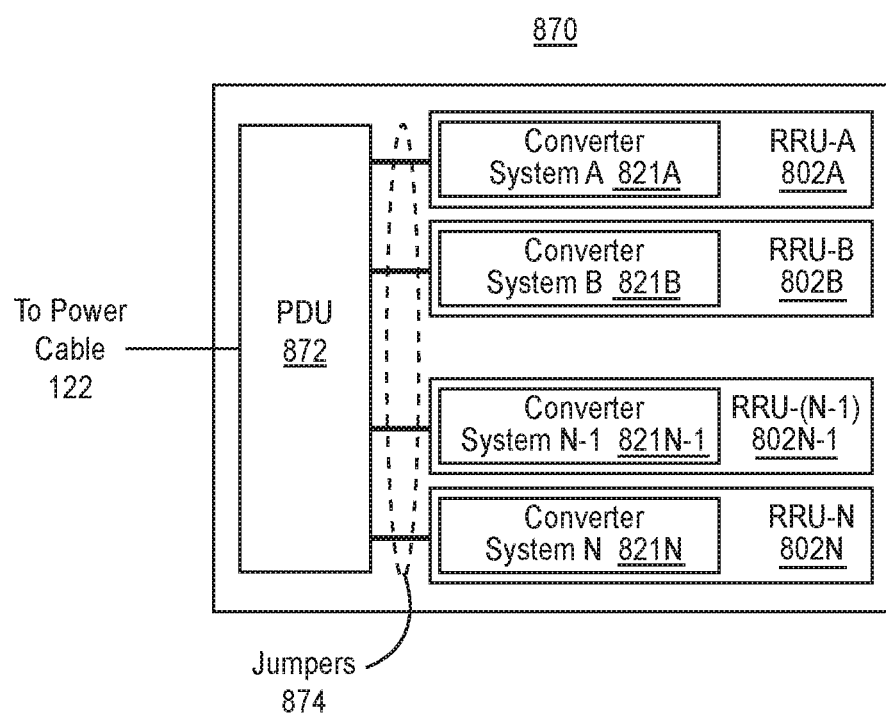
FIG. 8D illustrates a block diagram of one embodiment of a power distribution unit system.

FIG. 8D illustrates a block diagram of one embodiment of a power distribution unit (PDU) system 870. The PDU system 870 includes a PDU 872 that distributes power, from a power cable 122, to multiple, i.e. N, RRUs 802A-N. In this embodiment, the PDU 872 is co-located with the RRUs 802A-N, e.g. on a roof top or a tower. The PDU 872 is coupled to each RRU by a power jumper. The RRUs 902A-N respectively include high voltage DC-DC converter systems (converter systems) 821A-N so each RRU is capable of receiving high voltage directly from the PDU 872 via the jumper 874.

Figure 9:
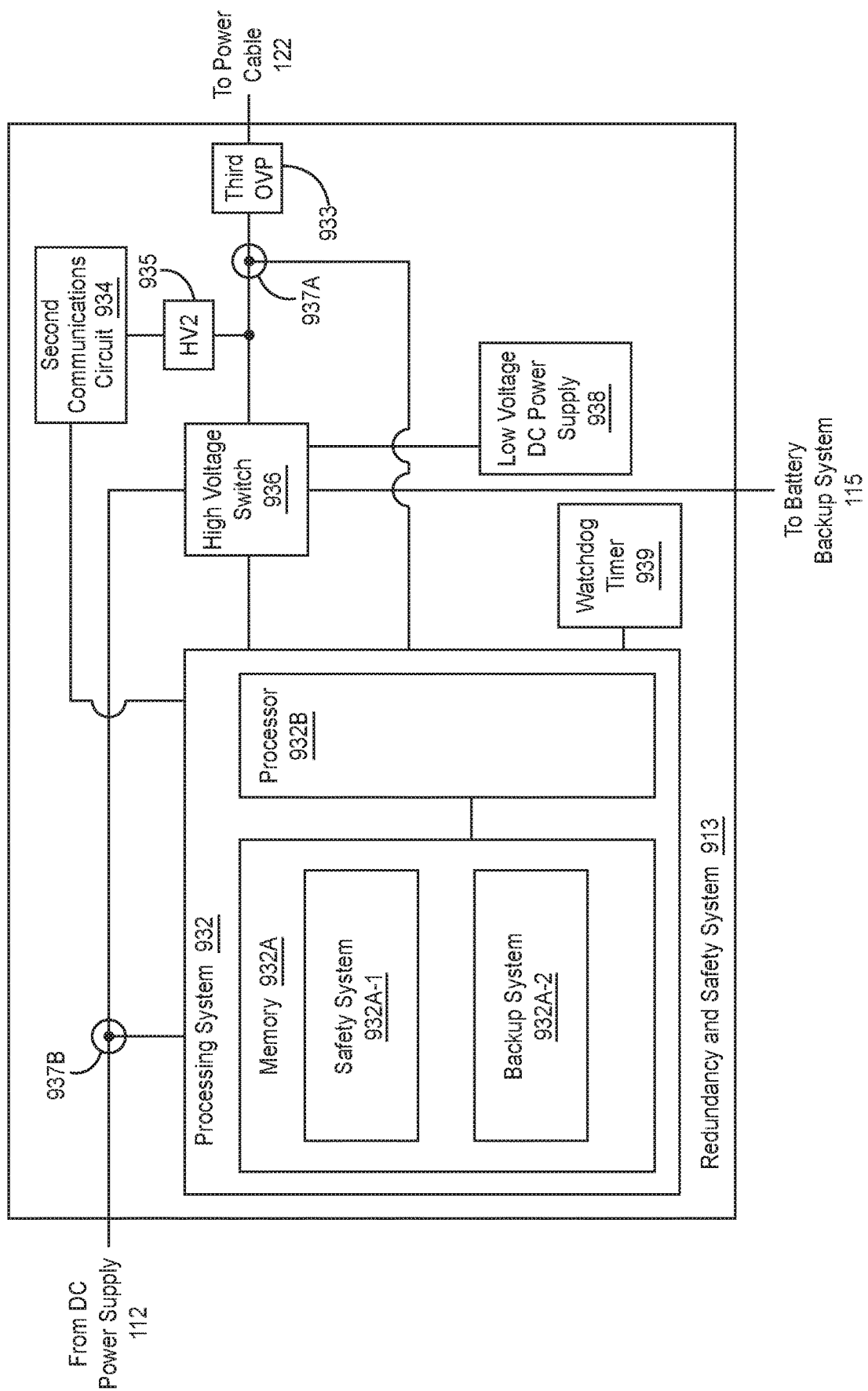
FIG. 9 illustrates a block diagram of one embodiment of a safety system when converting high voltages at a top of a tower.

FIG. 9 illustrates a block diagram of one embodiment of a redundancy and safety system (RSS) 913. The redundancy and safety system 913 includes a processing system 932, a second communications circuit 934, a second high voltage isolator (HV2) 935, a high voltage switch 936, and a low voltage DC power supply 938. In another embodiment, the high voltage switch 936 is a single pole, triple or quadruple throw switch, e.g. comprising field effect transistors. For example, when the high voltage switch 936 is a single pole, quadruple throw switch, it has an input that is grounded or is left floating so when selected the output of the redundancy and safety system 913 has a zero volt or floating output voltage; the zero volt or floating output voltage may be used when the redundancy and safety system 913 is set to a high safety mode. The second high voltage isolator 935 isolates the second communications circuit 934 from high voltage at the output of the redundancy and safety system 913, while permitting the second communications circuit 934 to transmit and receive data. The second high voltage isolator 935 may be a high voltage isolator like those exemplified for the first high voltage isolator 231A. In one embodiment, the second communications circuit 934 is the same product as used for the first communications circuit 231B.

The high voltage switch 936 is coupled to the processing system 932, the second communications circuit 934 (through the second high voltage isolator 935), the low voltage DC power supply 938, the DC power supply 112, the power cable 122, and the battery backup system 115. In one embodiment, a first voltage sensor 937A, which measures the output voltage of the redundancy and safety system 913, is coupled to the processing system 932. In another embodiment, the redundancy and safety system 913 includes a second voltage sensor 937B, which measures the voltage provided by the DC power supply 112, is coupled to the processing system 932. In another embodiment, the redundancy and safety system 913 includes a third over voltage protection circuit (OVP) 933 between the output of the redundancy and safety system 913 (or power cable 122) and the first voltage sensor 937 (or high voltage switch 936).

In one embodiment, the output voltage of the low voltage DC power supply 938 is between a voltage sufficient to power the converter communications system 231 and twelve volts, e.g. five volts. In another embodiment, the output current of the low voltage DC power supply 938 is current limited to 1 to 100 milliamps, e.g. 10 milliamps.

In one embodiment, the processing system 932 includes a memory 932A coupled to a processor 932B. The memory 932A and processor 932B may be implemented, in whole or in part, by a state machine or a field programmable gate array. In another embodiment, the memory 932A includes a safety system 932A-1 and a backup system 932A-2. In a further embodiment, the safety system 932A-1 and the backup system 932A-2 are software executed and/or processed on the processor 932B. The safety system 932A-1 controls whether a high voltage from the DC power supply 112 is provided, or is not provided, to the power cable, e.g. by controlling the position of the high voltage switch 936 and/or using techniques described elsewhere herein.

The backup system 932A-2 controls when the battery backup system 115 provides power to the power cable in lieu of the DC power supply 112, e.g. by controlling the position of the high voltage switch 936. In one embodiment, the processing system 932, e.g. the backup system 932A-2, is configured to receive the voltage measured by the second voltage sensor 937B, and to determine whether the DC Power supply 112 is delivering an adequate voltage level, e.g. above a predetermined threshold level. If the measured voltage is inadequate, e.g. below the predetermined threshold level, then the high voltage switch 936 discontinues providing power from the DC power supply 112 to the remote radio head 102 through the power cable 122, and provides power, e.g. from the battery backup system 115 to the remote radio head 102 through the power cable 122.

However, the high voltage switch 936 may switch from a high voltage provided by either the DC power supply 112 or battery backup system 115 in the event specific signal(s) are received or no signals are received by the second communications circuit 934, e.g. from the first communications circuit 231B. In one embodiment, if the power cable 122 is not coupled between the redundancy and safety system 913 and the at least one DC-DC voltage converter system 121, then no signals will be received from the first communications circuit 231B by the second communications circuit 934, and the processing system 932, e.g. the safety system 932A-1. As a result, the processing system, e.g. the safety system 932A-1, controls the high voltage switch 936 to couple a low voltage from the DC power supply 938 to the output of the redundancy and safety system 913. Thus, in another embodiment, the DC power supply 112 is isolated from the at least one DC-DC voltage converter system 121. In yet another embodiment, the DC power supply 112 is isolated from the at least one DC-DC voltage converter system 121 for a programmable time period, i.e. blanking time, before attempting to re-engaging power to cable 122.

In one embodiment, a removable cover plate is removed from an enclosure housing high voltage circuitry such as an overvoltage protection circuit or at least one DC-DC voltage converter, and interlocking switch(s) open and cause the first communications circuit 231B to issue a signal indicating such removal. Such a signal is received from the first communications circuit 231B by the second communications circuit 934, and the processing system 932, e.g. the safety system 932A-1. As a result, the processing system, e.g. the safety system 932A-1, controls the high voltage switch 936 to couple a low voltage from the DC power supply 938 to the output of the redundancy and safety system 913.

In one embodiment, the first voltage sensor 937A serves a feedback sensor to the processing system so that it can confirm that the redundancy and safety system 913 is outputting the appropriate voltage level, low or high. In another embodiment, if the voltage level is wrong, e.g. high when it should be low, then the processing system issues a warning alarm. In a further embodiment, the redundancy and safety system 913 commands the DC power supply 112 and/or the battery backup system 115, through communications link(s), to turn off.

In one embodiment, the redundancy and safety system 913 includes a watchdog timer 939 such as a Maxim Integrated Products, Inc. MAX6369. The watch dog timer 939 is coupled to the processing system 932. As further illustrated below, the watchdog timer 939 may reset the processing system 932 in case the processing system 932, e.g. the safety system 932A-1, is not properly performing its safety function; for example, this may be indicated by the processing system 932, e.g. the safety system 932A-1, not sending a reset signal to the watchdog timer 939 before the watch dog time count reaches a threshold level. Transmission of the reset signal by the processing system 932, e.g. the safety system 932A-1, indicates that the processing system 932 is functioning properly.

Figure 10:
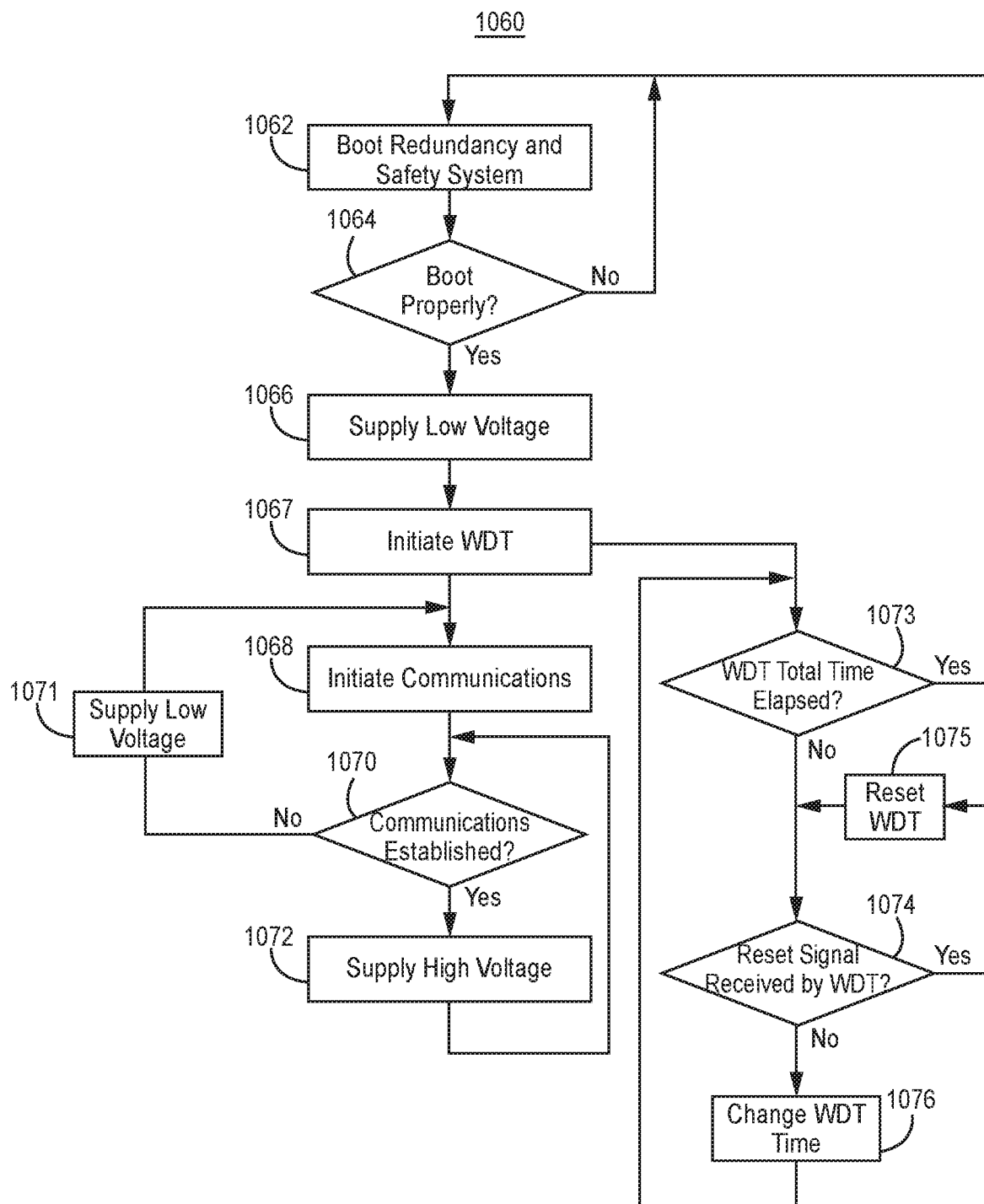
FIG. 10 illustrates a flow diagram of one embodiment of operation of a safety system.

FIG. 10 illustrates a flow diagram of one embodiment of operation of a redundancy and safety system 1060. To the extent that the embodiment of method 1060 shown in FIG. 10 is described herein as being implemented in the systems shown in FIGS. 1 through 9, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner). For purposes of clarity, the redundancy and safety system exemplified herein may or may not include a redundancy function.

In block 1062, boot a redundancy and safety system, e.g. a redundancy and safety system 113. In one embodiment, during this block, the output voltage of the safety system is disabled and an open circuit. In another embodiment, during this block, the output voltage is the output voltage of the low voltage power supply 938. In a further embodiment, the corresponding output current is current limited. In yet another embodiment, the first voltage sensor 937A measures the voltage at the output of the redundancy and safety system, e.g. when a low voltage is applied to the output of the redundancy and safety system. If the measured voltage is substantially less than the low voltage, e.g. substantially zero volts, then a short circuit condition is detected by the redundancy and safety system, e.g. the safety system 932A-1.

In block 1064, determine if the redundancy and safety system booted properly. In one embodiment, this entails the redundancy and safety system, e.g. the safety system 932A-1, determining if there is a short circuit at the output of the safety system.

If the redundancy and safety system was determined to not have booted properly, then return to block 1062. In another embodiment, issue a warning that the redundancy and safety system failed to boot properly. If the redundancy and safety system was determined to have booted properly, then proceed to block 1066 or block 1068.

Optionally, in block 1066, if it is not already doing so supply low voltage, e.g. from the low voltage DC power supply 938, to the output of the redundancy and safety system. Optionally, in block 1067, initiate a watch dog timer (WDT) 939.

In block 1068, initiate communications, e.g. with at least one DC-DC voltage converter system 121 configured to power at least one remote radio head 102. In another embodiment, initiating communications means sending query messages, e.g. from the second communications circuit 934 over the power cable 122 to the first communications circuit 231B. In a further embodiment, send such query messages that are requests for acknowledgement. In yet another embodiment, send query messages at a rate of at least two per second, e.g. five per second.

In block 1070, determine if communications have been established, e.g. with at least one DC-DC voltage converter system 121. In another embodiment, determine if communications have been established by determining if at least one acknowledgement (ACK) have been received by the second communications circuit 934 from the first communications circuit 231B. In a further embodiment, each acknowledgement is sent with a cyclic redundancy checksum (CRC), e.g. included in a check value. In yet another embodiment, the processing system 932A, e.g. the safety system 932A-1, evaluates the CRC to ensure that an ACK was truly received, and is not an error.

In one embodiment, only when the redundancy and safety system has just booted up, send a message, e.g.—from the safety system 932A-1 through the second communications circuit 934, over the power cable 122, through the first communications circuit 231B, and to the measurement and control system 233—to switch the converter communications system 231 from a low voltage mode to a high voltage mode. In another embodiment, upon receipt of such a message, switch the converter communications system 231 to a high voltage mode from a low voltage mode. In a further embodiment, send a message, e.g. from the converter communications system 231 acknowledging that it is ready to receive a high voltage from the redundancy and safety system.

If communications have not been established, e.g. because the power cable 122 has not been connected, e.g., to the at least one DC-DC voltage converter system 121, then return to block 1068. Optionally, if communications have not been established and before returning to block 106, then in block 1071 supply a low voltage, e.g. from the low voltage DC power supply 938, to the output of the redundancy and safety system 913 and the power cable 122. If communications have been established, then proceed to block 1072.

In block 1072, supply a high voltage, e.g. from the DC power supply 112 to the output of the redundancy and safety system 913 and the power cable 122. Then, return to block 1070.

When block 1067 is used, then from block 1067 also proceed in parallel to block 1073. In block 1073, determine if the watch dog timer total time has elapsed. For, example, the watch dog timer total time is one minute; however, this amount can vary and be selected by a user or system designer.

If the watch dog timer total time has elapsed, then return to block 1062 and re-boot the redundancy and safety system. If the watch dog timer total time has not elapsed, then in block 1074 determine if the watch dog timer 939 received a reset signal, e.g. from the processing system 932, processor 932B, or from the safety system 932A-1. The reset signal may originate as an alarm or another fault indicator. The reset signal resets a timer or counter of the watch dog timer 939 to its starting, or initial, time. As long as the processing system 932, processor 932B and/or the safety system 932A-1 operates normally, the processing system 932, processor 932B or from the safety system 932A-1 will periodically issue the reset signal.

If the reset signal is received by the watchdog timer 939, then in block 1076 reset the watch dog timer time to the starting time and return to block 1074. If the reset signal is not received by the watchdog timer 939, then in block 1076 change the watch dog timer time, e.g. by incrementing or decrementing the timer by a fixed amount and return to block 1073.

EXEMPLARY EMBODIMENTS

Example 1 includes an integrated power cable, comprising: a power cable having a first end and a second end; wherein the first end is configured to be electrically coupled to a DC power supply; at least one DC-DC voltage converter having at least one input and at least one output; wherein the second end is fixedly electrically and mechanically connected to the input; a first connector fixedly connected mechanically and electrically to the output; and wherein the first connector is configured to be coupled to at least one remote radio head.

Example 2 includes the integrated power cable of Example 1, wherein at least a portion of the at least one DC-DC voltage converter system and the second end are covered by an insulator.

Example 3 includes the integrated power cable of any of Examples 1-2, wherein a second connector is fixedly connected mechanically and electrically to the first end.

Example 4 includes the integrated power cable of any of Examples 1-3, wherein the at least one DC-DC voltage converter system comprises a synchronous step-down converter.

Example 5 includes the integrated power cable of any of Examples 1-4, wherein the at least one DC-DC voltage converter system comprises a converter communications system Example 6 includes a power cable, comprising: a power cable having a first end and a second end; wherein the first end is configured to be electrically coupled to a DC power supply; at least one DC-DC voltage converter having at least one input and at least one output; a first connector fixedly electrically and mechanically connected to the second end; a second connector fixedly electrically and mechanically connected to the at least one input; wherein the first connector is coupled to the second connector; and a third connector fixedly electrically and mechanically connected to the at least one output; and wherein the third connector is configured to be coupled to at least one remote radio head.

Example 7 includes the power cable of Example 6, wherein a fourth connector is fixedly connected mechanically and electrically to the first end.

Example 8 includes the power cable of any of Examples 6-7, wherein the at least one DC-DC voltage converter system comprises a synchronous step-down converter.

Example 9 includes the power cable of any of Examples 6-8, wherein the at least one DC-DC voltage converter system comprises a converter communications system Example 10 includes an apparatus, comprising: a first overvoltage protection circuit having a first input and a first output, and configured to be mounted on a tower proximate to at least one remote radio head; at least one DC-DC voltage converter system having at least one input coupled to the first output, and at least one output; a second overvoltage protection circuit having a second input coupled to the at least one output, and a second output coupled to at least one remote radio head; a first enclosure enclosing the at least one DC-DC voltage converter system and configured to be mounted on the tower proximate to the at least one remote radio head; wherein the first input is configured to be coupled to a power cable; and wherein the at least one output is configured to be coupled to the at least one remote radio head.

Example 11 includes the apparatus of Example 10, further comprising a heatsink mechanically attached to and thermally coupled to each of the at least one DC-DC voltage converter system, and mechanically attached to and thermally insulated from the enclosure.

Example 12 includes the apparatus of Example 11, wherein the heatsink is thermally coupled to each of the at least one DC-DC voltage converter with conductive heatsink compound.

Example 13 includes the apparatus of any of Examples 11-12, wherein the heatsink is thermally isolated from the enclosure with a thermal insulating gasket.

Example 14 includes the apparatus of any of Examples 10-13, wherein the at least one DC-DC voltage converter system comprises a synchronous step-down converter.

Example 15 includes the apparatus of any of Examples 10-14, wherein the at least one DC-DC voltage converter system comprises a converter communications system.

Example 16 includes the apparatus of any of Examples 10-15, wherein the first enclosure or a second enclosure encloses the second overvoltage protection circuit.

Example 17 includes an apparatus, comprising: a remote radio head, comprising: at least one DC-DC voltage converter system having a first input configured to receive a voltage between 380V and 400V and an output configured to provide between Example 3.3V and 48V; and a front end system having a second input coupled to the output of the at least one DC-DC voltage converter system; and wherein the first input is configured to be coupled to a power cable.

Example 18 includes the apparatus of Example 17, wherein the at least one DC-DC voltage converter system comprises a synchronous step-down converter.

Example 19 includes the apparatus of any of Examples 17-18, wherein the at least one DC-DC voltage converter system comprises a converter communications system.

Example 20 includes the apparatus of any of Examples 17-19, wherein the front end system comprises at least one of a low noise amplifier, a power amplifier, an upconverter, and a downconverter.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

The invention claimed is:

1. An apparatus, comprising:
an enclosure configured to be mounted on a mounting structure;
at least one DC-DC voltage converter, in the enclosure, having a converter power input configured to receive a voltage between 380V and 400V and a converter power output configured to provide between 3.3V and 48V;
at least one front end of a radio, in the enclosure, having a front end power input coupled to the converter power output;
wherein the converter input is configured to be coupled to a first end of a power cable; and
communications circuitry, in the enclosure, configured to communicate with safety circuitry configured to provide the voltage between 380V and 400V to a second end of the power cable only upon receipt of a signal from the communications circuitry.

2. The apparatus of claim 1, wherein the at least one DC-DC voltage converter comprises a synchronous step-down converter.

3. The apparatus of claim 1, wherein the front end comprises at least one of a low noise amplifier, a power amplifier, an upconverter, and a downconverter.

4. The apparatus of claim 1, wherein the mounting structure is a tower.

5. The apparatus of claim 1, further comprising low voltage conversion circuitry configured to receive the voltage between 380V and 400V and to provide a lower voltage to the at least one DC-DC voltage converter.

6. The apparatus of claim 1, further comprising a battery backup system;
wherein the safety circuitry comprises a redundancy system; and
wherein the redundancy system is coupled the battery backup system.

7. A method, comprising:
starting a safety system comprising a voltage output;
providing a first voltage at the voltage output of the safety system, where the first voltage is configured to power communications circuitry of a radio system, where the radio system is coupled to the voltage output by a power cable, where the radio system comprises an enclosure, the communications circuitry, the at least one DC-DC voltage converter, and at least one radio front end, where the at least one DC-DC voltage converter is coupled to the at least one radio front end, where the enclosure contains at least the at least one DC-DC voltage converter and at least one radio front end, and where the radio system is configured to be mounted on a mounting structure;
initiating communications between the safety system and the communications circuitry;
determining if communications between the safety system and the communications circuitry have been established; and
if communications have been established between the safety system and the communications circuitry, then providing at the voltage output between 380V and 400V.

8. The method of claim 7, further comprising determining if the safety system started properly.

9. The method of claim 8, wherein determining if the safety system started properly comprises determining if the voltage output is short circuited.

10. The method of claim 8, further comprising if the safety system is determined not to have started properly, then restart the safety system.

11. The method of claim 10, further comprising starting a timer which runs for a time period; and
after the time period ends, then restarting the safety system.

12. The method of claim 7, wherein initiating the communications between the safety system and the communications circuitry comprises sending a query message from the safety system to the communications circuitry.

13. The method of claim 7, wherein determining if the communications between the safety system and the communications circuitry have been established comprises determining if at least one acknowledgement message was received from the communications circuitry.

14. A power cable, comprising:
a power cable having a first end and a second end, where the first end is opposite the second end, and where the first end is configured to be electrically coupled to a DC power supply;
at least one DC-DC voltage converter having at least one converter input and at least one converter output, where the at least one converter input is fixedly electrically and mechanically connected to the second end, where the at least one converter input is configured to receive a voltage between 380V and 400V, and where the at least one converter output is configured to provide a lower voltage configured to power at least one radio;

a first connector fixedly electrically and mechanically connected to the at least one converter output;

wherein the at least one DC-DC voltage converter, a portion of the first connector, and the second end are covered by an insulator; and where the first connector is configured to be coupled to a power input of the at least one radio mounted on a mounting structure.

15. The power cable of claim 14, wherein the insulator is heat shrink material.

16. The power cable of claim 14, wherein the at least one DC-DC voltage converter comprises a synchronous step-down converter.

17. The power cable of claim 14, wherein the at least one DC-DC voltage converter comprises communications circuitry configured to communicate with safety circuitry, where the safety circuitry is configured to provide a voltage between 380V and 400V from the DC power supply to a second end of the power cable only upon receipt of a signal from the communications circuitry.

18. The power cable of claim 14, wherein the at least one radio comprises at least one remote radio head.

19. The power cable of claim 14, wherein the mounting structure comprises a tower.

* * * * *